United States Patent [19]

Hieber et al.

[11] Patent Number: 4,501,769
[45] Date of Patent: Feb. 26, 1985

[54] METHOD FOR SELECTIVE DEPOSITION OF LAYER STRUCTURES CONSISTING OF SILICIDES OF HMP METALS ON SILICON SUBSTRATES AND PRODUCTS SO-FORMED

[75] Inventors: Konrad Hieber, Munich; Claudia Wieczorek, Ottobrunn, both of Fed. Rep. of Germany

[73] Assignee: Siemens Aktiengesellschaft, Berlin & Munich, Fed. Rep. of Germany

[21] Appl. No.: 465,299

[22] Filed: Feb. 9, 1983

[30] Foreign Application Priority Data

Mar. 30, 1982 [DE] Fed. Rep. of Germany ....... 3211752

[51] Int. Cl.³ .......................... B05D 5/12; C23C 11/08
[52] U.S. Cl. .......................................... 427/95; 427/96
[58] Field of Search ................. 427/93, 95, 99, 96, 427/255.2

[56] References Cited

U.S. PATENT DOCUMENTS

| | | | |
|---|---|---|---|
| 3,801,365 | 4/1974 | Hrzek | 427/95 |
| 4,180,596 | 12/1979 | Crowder et al. | 427/93 |
| 4,228,212 | 10/1980 | Brown et al. | 427/93 |
| 4,283,439 | 8/1981 | Higashinakagawa et al. | 427/93 |
| 4,285,761 | 8/1981 | Fatula et al. | 427/93 |
| 4,332,839 | 6/1982 | Levinstein et al. | 427/93 |
| 4,359,490 | 11/1982 | Lehrer | 427/95 |
| 4,389,257 | 6/1983 | Geipel et al. | 427/93 |

OTHER PUBLICATIONS

E. Kinsbron et al., "High Conductivity Silicide on Polysilicon By Lift-Off/Reactive Sputter Edge", Abstracts of the Fifth International Thin-Film Congress in Herzlia (Israel), Sep. 1981, p. 193.
C. M. Melliar-Smith et al., "Chemical Vapor Deposited Tungsten for Semiconductor Metallizations", J. Electrochem. Soc., vol. 121, No. 2, (1973), pp. 298–303.

*Primary Examiner*—John H. Newsome
*Attorney, Agent, or Firm*—Hill, Van Santen, Steadman & Simpson

[57] ABSTRACT

Structured layers composed of high melting point metal silicides, such as tantalum silicide, are selectively deposited on substrates having at least some silicon and some non-silicon regions, such as are used in thin-film and semiconductor technology, by thermal decomposition of gaseous silicon and halogen compounds containing a high melting point metal in a reaction gas and depositing the metal silicide onto the silicon regions of the substrates while providing a gaseous hydrogen halide, such as hydrogen chloride, to the reaction gas and adjusting the substrate deposition temperature and the composition of the reaction gas to values at which a silicide nucleation in substrate regions, other than silicon regions, is suppressed during deposition of the metal silicide from the gaseous phase due to the presence of the hydrogen halide. The invention is useful for producing contact track levels in VLSI circuits.

11 Claims, 1 Drawing Figure

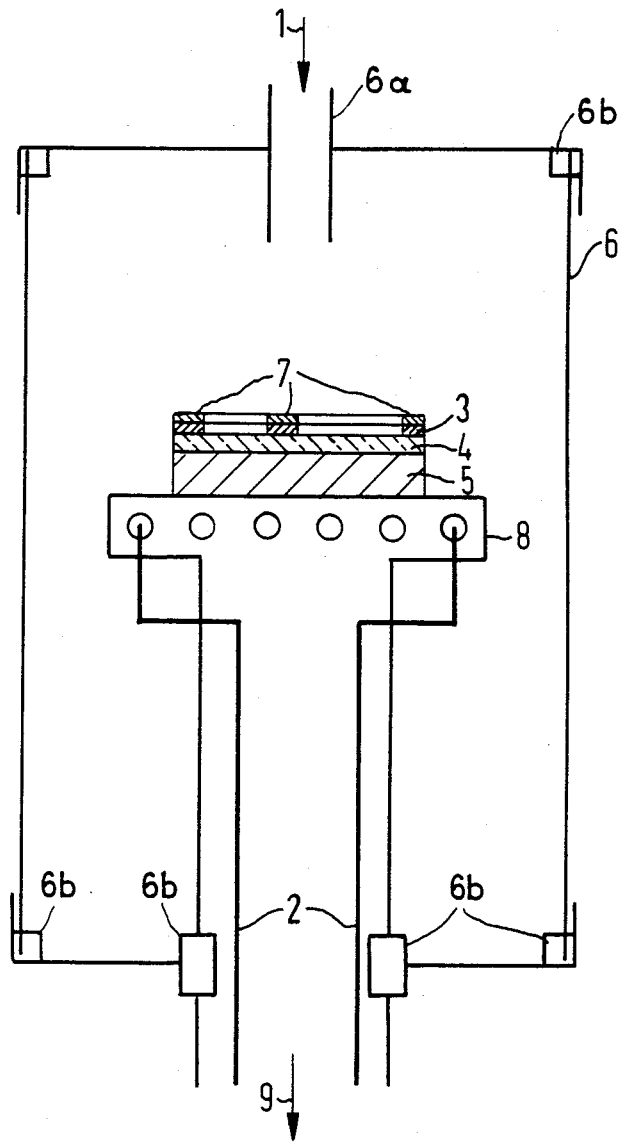

METHOD FOR SELECTIVE DEPOSITION OF LAYER STRUCTURES CONSISTING OF SILICIDES OF HMP METALS ON SILICON SUBSTRATES AND PRODUCTS SO-FORMED

BACKGROUND OF THE INVENTION

1. Field of the Invention

The invention relates to integrated semiconductor circuits and somewhat more particularly to a method of selectivity depositing layer structures composed of silicides of high melting point metals on silicon substrates, such as are used in thin-film and semiconductor technology.

2. Prior Art

In VLSI (very large scale integration) technology, highly doped polysilicon gate-contact material in MOS devices is replaced with a layer combination exhibiting a lower resistance, for example, one composed of a 300 nm thick doped polysilicon layer and a 200 nm thick metal disilicide layer wherein the metal is molybdenum, tungsten or tantalum. However, problems exist in etching such double layers so that no steps or overhangs occur at the edges of the structures or tracks (or lines) composed of such metal silicides.

A technique for overcoming this problem comprises a two-stage dry etching process, or "lift-off" technique. In this regard, reference is made to a lecture by Kinsborn, Fraser and Vratny documented in the Abstracts of the Fifth International Thin-Film Congress in Herzlia (Israel) from September 21 through 25 (1981), on page 193.

Avoiding this relatively complicated involved process would effect an increase in device yield and provide a significant reduction in fabrication costs. With the use of the CVD (chemical vapor deposition) process, which deposits a material from a gaseous phase after thermal decomposition of a gaseous compound containing such material, it is possible to selectively deposit tungsten on silicon and not on silicon oxide ($SiO_2$), see C. M. Melliar-Smith et al, J. Electrochem. Soc., Vol. 121, No. 2, (1973) pages 298–303, particularly page 299. Accordingly, it is possible to structure doped polysilicon in a problem-free manner according to hitherto known methods and to subsequently coat only the resultant polysilicon track with tungsten. A prerequisite for this, however, is that all regions of the device which are not to be coated with tungsten, must be occupied by $SiO_2$. A disadvantage of this special technique is that tungsten forms volatile oxides so that a protective layer must be utilized. Further, tungsten reacts with a silicon base or substrate at temperatures above 600° C., which produces an undesired roughness of the layer surface.

Since temperatures up to 1100° C. are utilized in many VLSI processes, the advantages of a selective deposition of tungsten on silicon tracks cannot be fully exploited. Moreover, it has turned out that tantalum silicide is superior to tungsten silicide in regard to adhesion and oxidizability and forms a $SiO_2$ passivation layer at higher temperatures.

SUMMARY OF THE INVENTION

The invention provides a method for selectively depositing a silicide of a high melting point (HMP) metal on substrates having at least some silicon regions whereby the stability of the deposited silicide relative to oxygen is insured at higher temperatures and the so-deposited silicide exhibits only a slight tendency to react with the silicon substrate, even at temperatures above 600° C. Further, by practicing the principles of the invention, the production process of VLSI circuits is significantly simplified, particularly in generating contact track levels and, as a result, the yield of functional components is increased.

In accordance with the principles of the invention, layer structures composed of HMP metal silicides are selectively deposited on substrates containing at least some silicon regions, as are particularly used in thin-film and/or semiconductor technology, by thermally decomposing gaseous silicon and halogen compounds containing the HMP metal in a reaction gas and depositing the metal silicide from the gaseous phase onto a controllably heated substrate containing silicon regions while providing a gaseous hydrogen halide, such as hydrogen chloride, hydrogen bromide or hydrogen iodine, to the reaction gas and adjusting the substrate deposition temperature and composition of the reaction gas to values at which silicide nucleation in regions of the substrate other than silicon regions is suppressed during deposition from the gaseous phase due to the presence of the hydrogen halide.

In certain embodiments of the invention, the gaseous silicon compound comprises a halogenated silane which splits-off a hydrogen halide during the thermal decomposition. In other embodiments, a gaseous hydrogen halide is added to the reaction gas during the depositing process from a gaseous phase. The reaction gas can also be diluted with hydrogen and/or inert gases.

In an exemplary embodiment of the invention, a reaction gas is comprised of a gaseous HMP-metal halogenide ($MeCl_x$) wherein Me is a high melting point metal and x is a number, hydrogen ($H_2$) and a halogenated silane compound ($SiH_{4-n}Cl_n$) wherein n is a number less than 4, and which has a mixing ratio of about $1(MeCl_x):10(H_2):2(SiH_{4-n}Cl_n)$, while the substrate is maintained at a temperature in the range about 450° through about 900° C. at an overall gas pressure in the range of about 50 through about 1000 Pa.

In certain embodiments of the invention, where tantalum silicide structures are desired, the reaction gas is provided with about 1 part by volume of tantalum pentachloride, about 2 parts by volume of dichlorosilane and about 10 parts by volume of hydrogen.

In certain embodiments of the invention, where molybdenum silicide structures are desired, the reaction gas is provided with about 1 part by volume of molybdenum pentachloride, about 2 parts by volume of dichlorosilane and about 10 parts by volume of hydrogen.

In certain embodiments of the invention, after deposition of a desired HMP-metal silicide structure is completed, the resultant coated substrate is subjected to a surface-wide etching process, for example in a hydrofluoric acid/nitric acid mixture or in a plasma to remove a very thin silicide film that may form on substrate regions other than silicon regions.

The principles of the invention are particularly useful for producing contact tracks (or lines) composed of tantalum, tungsten or molybdenum silicide for integrated semiconductor circuit, particularly VLSI circuits.

BRIEF DESCRIPTION OF THE DRAWING

The FIGURE is an enlarged, somewhat schematic view of an apparatus useful in the practice of the invention

DESCRIPTION OF PREFERRED EMBODIMENTS

The invention will now be further explained on the basis of an exemplary embodiment, for example, for selectively depositing a contact metal layer composed of tantalum disilicide (TaSi$_2$) on a silicon substrate.

An enclosed CVD reaction housing 6 having a reaction chamber therein is provided with a gas inlet 6a connected to a controllable gas source, schematically indicated by arrow 1. The reaction gas in the gas source comprises, in the exemplary embodiment under discussion, a mixture of 1 part by volume of tantalum pentachloride (TaCl$_5$), 10 parts by volume of hydrogen (H$_2$) and/or an inert gas, and 2 parts by volume of dichlorosilane (SiH$_2$Cl$_2$). A vacuum pump (not shown) is also connected with the reaction chamber of housing 6, such as schematically indicated by arrow 9, for evacuating the reaction chamber of undesired reaction products and for aiding in maintaining a desired pressure within the enclosed reaction chamber.

A substrate support means 8 is positioned in the interior of housing 6 and is coupled with a controllable electrical heating means 2 for maintaining a desired temperature on a substrate 5. Suitable sealing and insulating means 6b are provided at the ingresses and egresses of the various components communicating with the reaction chamber so as to maintain an enclosed atmosphere. The substrate 5 is comprised of a silicon body having a continuous insulating layer 4 thereon, which in the exemplary embodiment is composed of SiO$_2$. Structured discrete (or discontinuous) silicon layers 3 are positioned on insulating layer 4.

During operation, the composite substrate (elements 3, 4 and 5) is heated to about 850° C. via the heating means 2 and the abovedescribed reaction gas is controllably fed into the interior of the housing 6 until an overall gas pressure of about 133 Pa is attained. These temperature-pressure conditions are then maintained during the deposition process. Under these conditions, the reaction gas decomposes within the low-pressure CVD reactor housing 6 and a tantalum disilicide layer 7 is deposited only on the silicon layer 3 and not on the SiO$_2$ layer 4, covering the underlying silicon body 5.

The growth rate under the foregoing conditions amounts to about 100 nm/min.

If desired, a different insulating layer, such as one composed of aluminum oxide (Al$_2$O$_3$), tantalum pentoxide (Ta$_2$O$_5$) or silicon nitride (Si$_3$N$_4$) can be utilized as the insulating layer 4, instead of the SiO$_2$ layer present in the exemplary embodiment. Further, molybdenum pentachloride or tungsten pentachloride can be utilized in the reaction gas, instead of tantalum pentachloride and trichlorosilane or monochlorosilane can be utilized in place of dichlorosilane. The deposition process parameters change in accordance with the amount of hydrogen halide, such as hydrogen chloride, formed during the thermal decomposition and are readily determined empirically.

Should very thin silicide films nonetheless incidentally form on areas other than on the free or discontinuous silicon regions 3 of a composite substrate during the HMP-metal silicide deposition, then the entire resultant structure can be subjected to a surface-wide etching process, for example, in a hydrofluoric acid/nitric acid mixture or in a plasma.

The following considerations may, at least in part, explain the substrate-associated, and, thus, the selective deposition of the metal silicides:

On the basis of thermo-dynamic calculations, tantalum disilicide, in order to be formed in accordance with the equation:

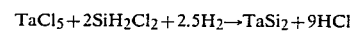
$$TaCl_5 + 2SiH_2Cl_2 + 2.5H_2 \rightarrow TaSi_2 + 9HCl$$

must be capable of formation at temperatures around 800° C., independently of the substrate material. The fact that, with the inventive method, the foregoing reaction does not occur on, for example, SiO$_2$, or occurs only very slowly thereon, could be connected to the fact that the reaction gas mixture releases an excess of, for example, chlorine, or hydrogen chloride, which inhibits the course of the reaction in the described manner. Hydrogen disassociating at the silicon surface could contribute to the formation of monosilane so that a reaction in accordance with the following equation:

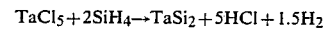
$$TaCl_5 + 2SiH_4 \rightarrow TaSi_2 + 5HCl + 1.5H_2$$

occurs at the silicon surface. The foregoing reaction is extremely favored thermo-dynamically and could thus explain the high selectivity of HMP metal silicide deposition on silicon surface areas in accordance with the principles of the invention.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative, and is not to be construed or interpreted as being restrictive or otherwise limiting of the present invention, excepting as it is set forth and defined in the hereto-appended claims.

We claim as our invention:

1. A method for selectively depositing layer structures composed of a silicide of a high melting point metal on a substrate surface containing silicon and non-silicon regions, as is particularly used in thin-film and semiconductor technology, by thermal decomposition of gaseous silicon and halogen compounds containing a high melting point metal to produce silicides of such metal and depositing the resultant metal silicide from said gaseous phase onto only the silicon regions of a heated substrate containing silicon and non-silicon regions, said method comprising:
    providing a hydrogen halide gas to said reaction gas, said hydrogen halide being selected from the group consisting essential of hydrogen chloride, hydrogen bromide and hydrogen iodine; and
    adjusting the substrate temperature and the composition of said reaction gas to respective values at which a nucleation in regions other than on said silicon regions is suppressed during deposition of said metal silicide from such gaseous phase due to the presence of said hydrogen halide.

2. A method as defined in claim 1 wherein the deposition of said silicide from the gaseous phase occurs with silanes splitting off a hydrogen halide during the thermal decomposition.

3. A method as defined in claim 1 wherein said hydrogen halide is added to said reaction gas during the deposition of said silicide from the gaseous phase.

4. A method as defined in claim 1 wherein hydrogen or an inert gas is admixed with said reaction gas.

5. A method as defined in claim 1 wherein said reaction gas is comprised of an admixture of a gaseous metal halogenide having the formula $MeCl_x$ wherein Me is a high melting point metal and x is a number, hydrogen ($H_2$) and a gaseous halogenated silane compound having the formula ($SiH_{4-n}Cl_n$) wherein n is a number less than 4, in a mixing ratio of $1(MeCl_x):10(H_2):2(SiH_{4-n}Cl_n)$ while said substrate temperature is maintained in the range of about 450° to about 900° C. with an overall gas pressure in the range of about 50 through about 1000 Pa.

6. A method as defined in claim 5 wherein said layer structure is composed of tantalum disilicide and said reaction gas consists of a mixture of 1 part by volume of tantalum pentachloride, 10 parts by volume of hydrogen and 2 parts by volume of dichlorosilane.

7. A method as defined in claim 5 wherein said layer structure is composed of molybdenum disilicide and said reaction gas consists of a mixture of 1 part by volume of molybdenum pentachloride, 10 parts by volume of hydrogen and 2 parts by volume of dichlorosilane.

8. A method as defined in claim 1 wherein after the deposition of said metal silicide is completed, the resultant substrate is subjected to a surface-wide etching in a hydrofluoric acid/nitric acid mixture or in a plasma.

9. A method of selectively depositing a layer structure composed of tantalum silicide on a substrate having at least some free silicon and some non-silicon regions, comprising:

positioning said substrate in an enclosed CVD reaction chamber having means therein for selectively heating said substrate to a temperature in the range of about 400° C. to about 900° C.;

feeding a reaction gas into said chamber, said reaction gas consisting of a mixture of 1 parts by volume of tantalum pentachloride, 10 parts by volume of hydrogen or an inert gas and 2 parts by volume of dichlorosilane; and adjusting the temperature of said substrate to about 850° C. while adjusting the pressure of said reaction gas to about 133 Pa so that gaseous hydrogen chloride is formed upon decomposition of said reaction gas and tantalum silicide is deposited only on said silicon regions of the substrate.

10. A method for selectively depositing a metal silicide wherein the metal is selected from the group consisting of molybdenum, tungsten and tantalum upon a composite substrate surface, said composite substrate surface having a continuous insulative layer selected from the group consisting of silicon dioxide, aluminum oxide, tantalum pentoxide, and silicon nitride on which layer is selectively deposited discrete areas of silicon, said method comprising the steps of:

(A) exposing in a chamber said composite substrate surface to a gaseous reaction mixture, said gaseous mixture containing
 (a) a gaseous halide of said metal,
 (b) a gaseous haligenated silane, and
 (c) a hydrogen halide selected from the group consisting of hydrogen chloride, hydrogen bromide, and hydrogen iodide, (B) maintaining said substrate at a temperature ranging from about 450° to 900° C., and (C) maintaining said gaseous mixture at a pressure of from about 50 to 1000 Pa whereby said metal silicide is generated in situ and is selectively deposited substantially only on said discrete areas of silicon.

11. A method for selectively depositing metal silicide comprising the steps of simultaneously (A) exposing in a chamber a composite substrate surface to a gaseous reactive mixture,
 said composite substrate comprising a continuous insulation layer comprised of a compound selected from the group consisting of silicon dioxide, aluminum oxide, tantalum pentoxide, and silicon nitride on which layer is selectively deposited discrete areas of silicon, said gaseous mixture containing
 (a) a gaseous halide of a metal selected from the group consisting of molybdenum, tungsten, and tantalum,
 (b) a gaseous halogenated silane,
 (c) a hydrogen halide selected from the group consisting of hydrogen chloride, hydrogen bromide, and hydrogen iodide, (B) heating said substrate to a temperature ranging from about 450° to 900° C., (C) maintaining said gaseous mixture at a pressure ranging from about 50 to 1000 Pa, and (D) selectively depositing on said discrete areas of silicon, a silicide of said metal generated in said gaseous mixture.

* * * * *